United States Patent
Lin et al.

(10) Patent No.: US 6,603,151 B2
(45) Date of Patent: Aug. 5, 2003

(54) METHOD AND STRUCTURE FOR PACKAGING A HIGH EFFICIENCY ELECTRO-OPTICS DEVICE

(75) Inventors: Ming-Der Lin, Hsinchu (TW); Chang-Da Tsai, Chiayi (TW); Kwang-Ru Wang, Chiayi (TW); Ching-Liang Kao, Taitung (TW); Wen-Liang Tseng, Hsinchu (TW); Chia-Chen Chang, Ilan (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 10/085,584

(22) Filed: Mar. 1, 2002

(65) Prior Publication Data

US 2002/0131726 A1 Sep. 19, 2002

(30) Foreign Application Priority Data

Mar. 15, 2001 (TW) ........................... 90106117 A

(51) Int. Cl.$^7$ .................... H01L 31/0312; H01L 33/00
(52) U.S. Cl. .................. 257/98; 257/77; 257/99; 257/100; 257/103; 257/676
(58) Field of Search .......................... 257/77, 98, 99, 257/100, 676, 103; 438/25, 26, 29, 32; 362/296, 341, 297, 300, 307, 311, 347, 348

(56) References Cited

FOREIGN PATENT DOCUMENTS

JP 09-64421 * 3/1997

* cited by examiner

Primary Examiner—Minh Loan Tran
Assistant Examiner—Tan Tran
(74) Attorney, Agent, or Firm—Sughrue Mion, PLLC

(57) ABSTRACT

A method and a structure for packaging an electro-optics device are disclosed. A transparent material is added between the die carrier and the electro-optics device, so that the light emitted from the backside of the electro-optics device can be extracted. Furthermore, a light reflective layer is formed on the die carrier, and a pattern of the light reflective layer is designed to prevent the light from being reflected to the active layer, the reflecting decreasing light-emitting efficiency again.

20 Claims, 5 Drawing Sheets

METHOD AND STRUCTURE FOR PACKAGING A HIGH EFFICIENCY ELECTRO-OPTICS DEVICE

FIELD OF THE INVENTION

The present invention relates to a method and a structure of an electro-optics device. More particularly, the present invention relates to a structure for packaging an electro-optics device with high efficiency and the forming method thereof.

BACKGROUND OF THE INVENTION

There are many kinds of light-emitting diodes that are utilized now. According to the packaging method, the light-emitting diodes are classified as through-hold light-emitting diodes, surface-mounted light-emitting diodes, and flip-chip light-emitting diodes.

Referring to FIG. 1, a conventional packaging structure comprising a light-emitting cell fixed on a die carrier is shown. The light-emitting cell comprises an epitaxial structure 10 formed on a conventional substrate 20. The epitaxial structure 10 comprises an n-type semiconductor layer, an active layer, and a p-type semiconductor layer. With the progress that the semiconductor process has been making, after the epitaxial structure 10 is completed, a transparent substrate can be utilized to replace the conventional substrate 20 for increasing the light-emitting diode's output intensity. In this way, the light emitted by the light-emitting diode is not absorbed by the opaque conventional substrate. The light-emitting cell can emit light from its top and bottom surfaces, thereby increasing its light-emitting efficiency.

As shown in FIG. 1, a die carrier 30, such as a lead frame, a print circuit board, or a header, is connected to the substrate 20 to form a first electrode of the light-emitting cell. The silver paste, conductive paste, or bond of eutectic is utilized to fix the cell-fixing surface 40 between the light-emitting cell and the die carrier 30. Then, a second electrode 50 of the light-emitting cell is connected to another end of the lead frame 35. Thereafter, when the power is supplied to the die carrier 30 and the lead frame 35, the epitaxial structure 10 of light-emitting cell can emit light.

Referring to FIG. 2, when the light-emitting cell's substrate 70 is made of the electrically insulating material, the silver paste is utilized to fix the light-emitting cell on the cell-fixing surface 95 of the die carrier 100 as described above. Then, the first electrode 80 and the second electrode 90 on the light-emitting cell are respectively connected to the die carrier 100 and the lead frame 105. Thereafter, when the power is supplied to the die carrier 100 and the lead frame 105, the light-emitting cell's epitaxial structure 60 can emit light.

However, because the conventional light-emitting cell is directly fixed on the die carrier, the light generated by the epitaxial structure is absorbed by the cell-fixing surface between the cell and the die carrier. Although the conventional substrate has been replaced by the transparent substrate, most of the light emitted from the substrate is still absorbed by the cell-fixing surface. Therefore, the light-emitting efficiency is decreased, so that the advantage of light emitted from both sides of the light-emitting cell cannot be fully presented.

SUMMARY OF THE INVENTION

According to the above background of the invention, the cell-fixing surface absorbs the light emitted from the LED cell, resulting in a disadvantage that the light-emitting efficiency is reduced after the LED cell is fixed on the die carrier. Hence, this invention provides a method and structure for packing a high efficiency electro-optics device.

It is therefore an objective of this invention to provide a method and a structure for packaging an electro-optics device. A transparent material is added between the die carrier and the electro-optics device, so that the light emitting from the electro-optics device is not directly absorbed by the cell-fixing surface.

It is therefore another objective of this invention to provide a method and a structure for packaging an electro-optics device. A light reflective layer is formed on the die carrier, and a pattern of the light reflective layer is designed to prevent the light from being reflected again back to the active layer, wherein the light reflection decreasing light-emitting efficiency.

It is therefore another objective of this invention to provide a method and a structure for packaging an electro-optics device. With the utilization of the present invention, the requirement of increasing the output power for the electro-optics device can be substantially achieved by increasing the optical path of the electro-optics device.

In accordance with all aspects of this invention, the invention provides a structure for a high efficiency electro-optics device, comprising: a die carrier; a light reflective layer located upon the die carrier for changing the emitted light to a reflected light and also making part of the emitted light unparallel to the direction of the reflected light; a transparent layer located on the light reflective layer; and an electro-optics cell fixing on the transparent layer, wherein a first electrode and a second electrode are electrically connected respectively to the die carrier and a lead frame.

In accordance with the aforementioned objects of this invention, this invention provides a method for forming a high efficiency electro-optics device, comprising: providing a die carrier; forming a light reflective layer upon a surface of the die carrier, wherein the light reflective layer has a pattern for changing an emitting light to a reflecting light and making part of the emitted light unparallel to the direction of the reflected light; forming a transparent layer upon the light reflective layer; fixing an electro-optics cell on the transparent layer; and respectively electrically connecting a first electrode and a second electrode of the electro-optics cell to the die carrier and a lead frame.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
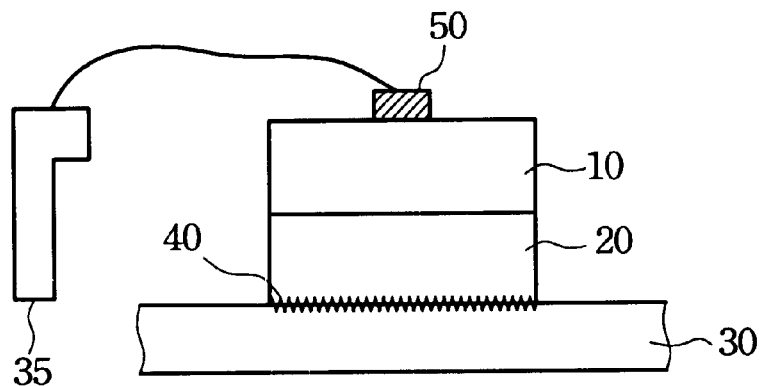
FIG. 1 is a cross-sectional view, showing a conventional packaging structure comprising a light-emitting cell fixed on a die carrier.
Figure 2:
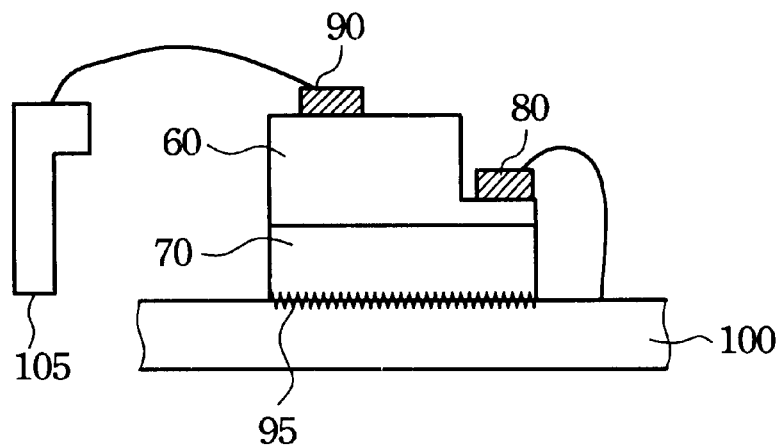
FIG. 2 is a cross-sectional view, showing a conventional packaging structure comprising a light-emitting cell having an electrically insulating substrate fixed on a die carrier.
Figure 3:
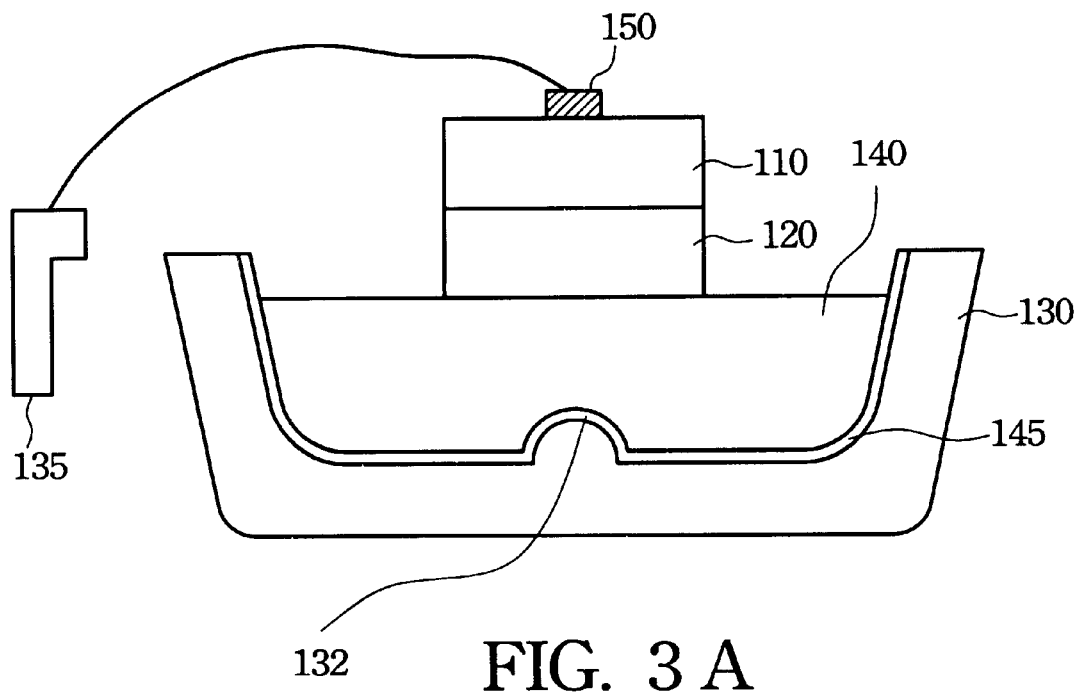
FIG. 3A is a cross-sectional view, showing the packaging structure of a light-emitting cell fixed on a die carrier of the present invention.
FIG. 3B is showing another embodiment according to FIG. 3A, wherein the light reflective layer is located in the transparent conductor layer.
Figure 3:
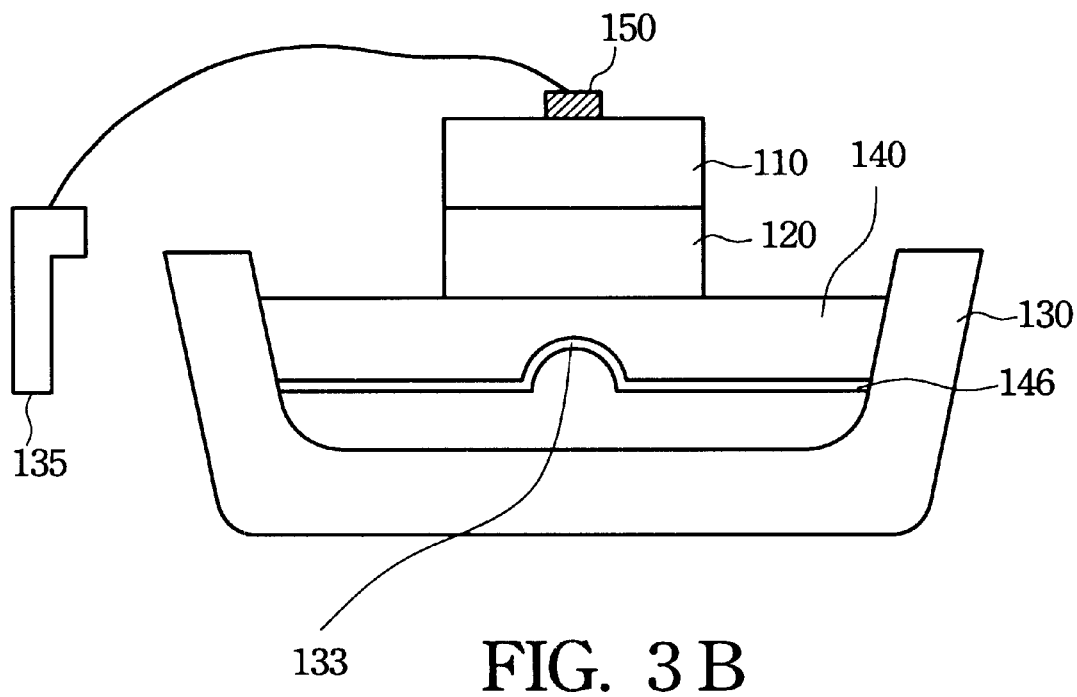

In order to obtain the advantage of the light emitted from both sides of the light-emitting cell, FIG. 3A shows the cross-sectional view of the present invention. Since the light absorption of the conventional cell-fixing surface decreases the light-emitting efficiency of the light-emitting cell, the present invention uses the casting technique to provide a sinking die carrier 130 and a light reflective layer 145 having a hemispheric lift 132, located upon the die carrier 130. The light reflective layer 145 is made of the material with high reflectance.

Then, a transparent conductor layer 140, such as an indium tin oxide (ITO) layer, a cadmium tin oxide (CTO) layer, a zinc oxide (ZnO) layer, an indium zinc oxide (IZO) layer, or a nickel oxide (NiO) layer, is formed upon the sinking surface of the die carrier 130; and the transparent substrate 120 of the light-emitting cell is then fixed on the transparent conductor layer 140. Consequently, the manufacturing of the first electrode is completed, and the electrical connections among the transparent substrate 120, transparent conductor layer 140, and die carrier 130 are also completed.

When the light-emitting cell is fixed upon the transparent conductor layer 140, a second electrode 150 is electrically connected to another lead frame 135. Thus, the packaging structure of the electro-optics device of the present invention is obtained.

Referring to FIG. 3B, it shows that the light reflective layer 146 is located in the transparent conductor layer 140 according to the structure of FIG. 3A.

According to these two embodiments described above, when the light is generated by the epitaxial structure 110 and emitted from the transparent substrate 120, it runs through the transparent conductor layer 140 and reaches the light reflective layer 145 or the light reflective layer 146. Owing to the high reflectance of the light reflective layer 145 or the light reflective layer 146, most of the light is reflected out of the structure, and is not absorbed. In this way, the light-emitting efficiency of the light-emitting cell can be increased significantly.

Moreover, in order to prevent the light reflective layer 145 or 146 from reflecting the light generated by the epitaxial structure 110 once again back to the active layer of the epitaxial structure 110, the reflecting causing the light in the active layer to be re-absorbed thus decreasing light-emitting efficiency of the light-emitting diode, the present invention provides a design of the light reflective layers 145 and 146 with the hemispheric lifts 132 and 133. When the light generated by the epitaxial structure 110 reaches the hemispheric lift 132 or 133, the light is reflected to various directions. Consequently, the light is not reflected back to the active layer of the light-emitting cell 110 again or absorbed by the active layer, the reflecting and absorbing phenomena decreasing the light-emitting efficiency of the light-emitting cell.

Figure 4:
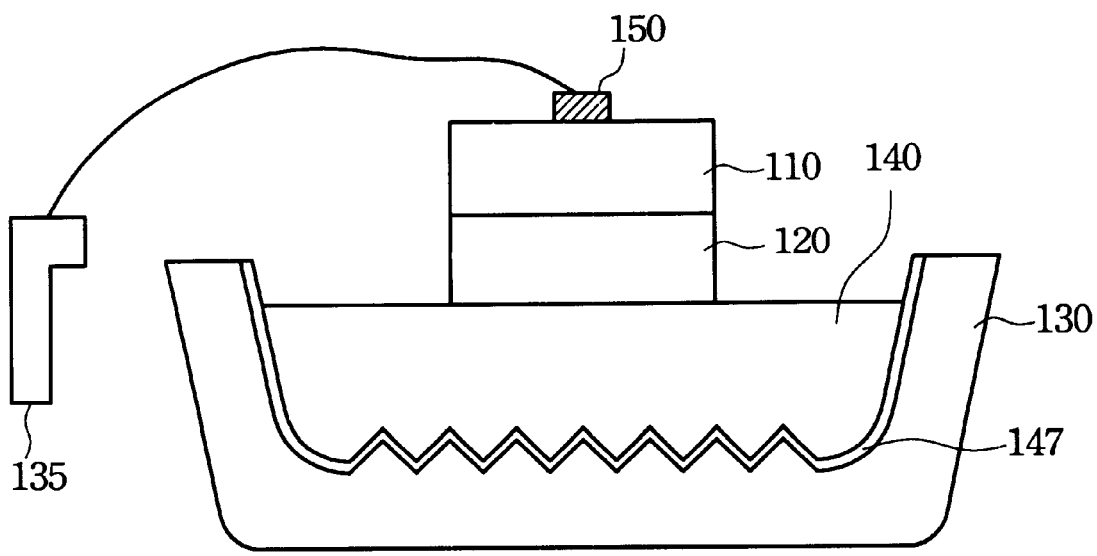
FIG. 4A is a cross-sectional view showing the packaging structure of a light-emitting cell fixed on a die carrier of the present invention.
FIG. 4B is showing another embodiment according to FIG. 4A, wherein the light reflective layer is located in the transparent conductor layer.
Figure 4:
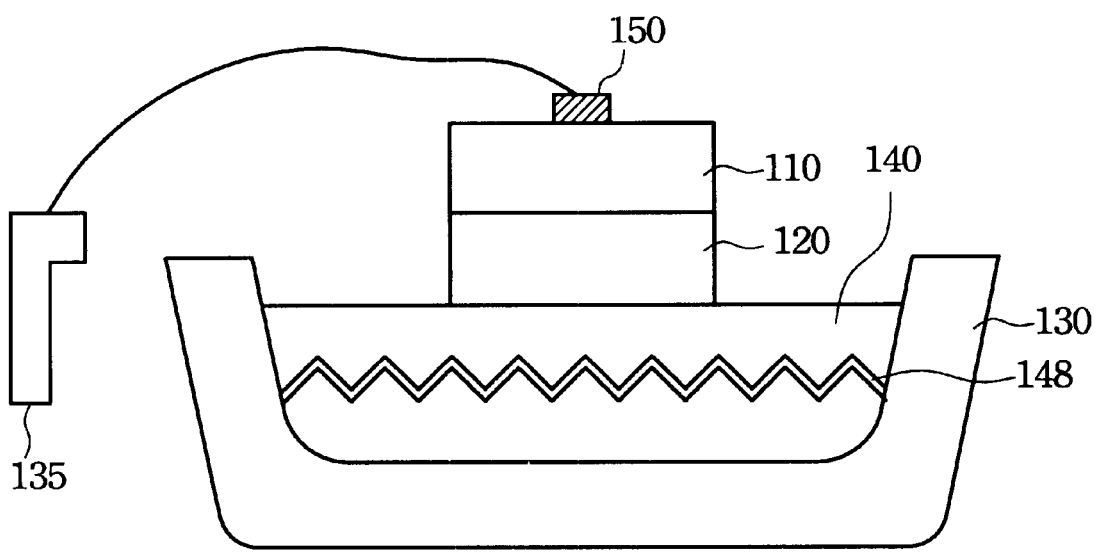

The pattern of hemispheric lifts 132 or 133 is only stated as an example for the present invention, and the present invention is not limited thereto. As shown in FIGS. 4A and 4B, the light reflective layers 147 and 148 have a pattern of grating structure respectively located upon the die carrier 130 and in the transparent conductor layer 140 to achieve the same effect as described above. Therefore, the grating structure also can prevent the reflected light going back to the active layer of the epitaxial structure 110. The designs or functions have the similar features of the present invention.

Figure 5:
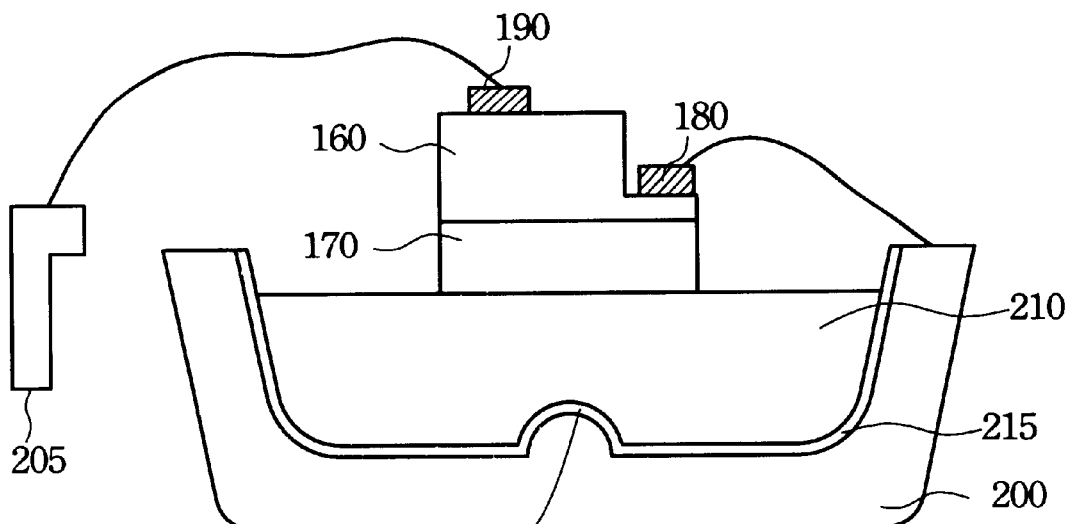
FIG. 5A is a cross-sectional view, showing the packaging structure comprising a light-emitting cell having the electrically insulating substrate fixed on a die carrier of the present invention.
FIG. 5B is showing another embodiment according to FIG. 5A, wherein the light reflective layer is located in the transparent conductor layer.
Figure 5:
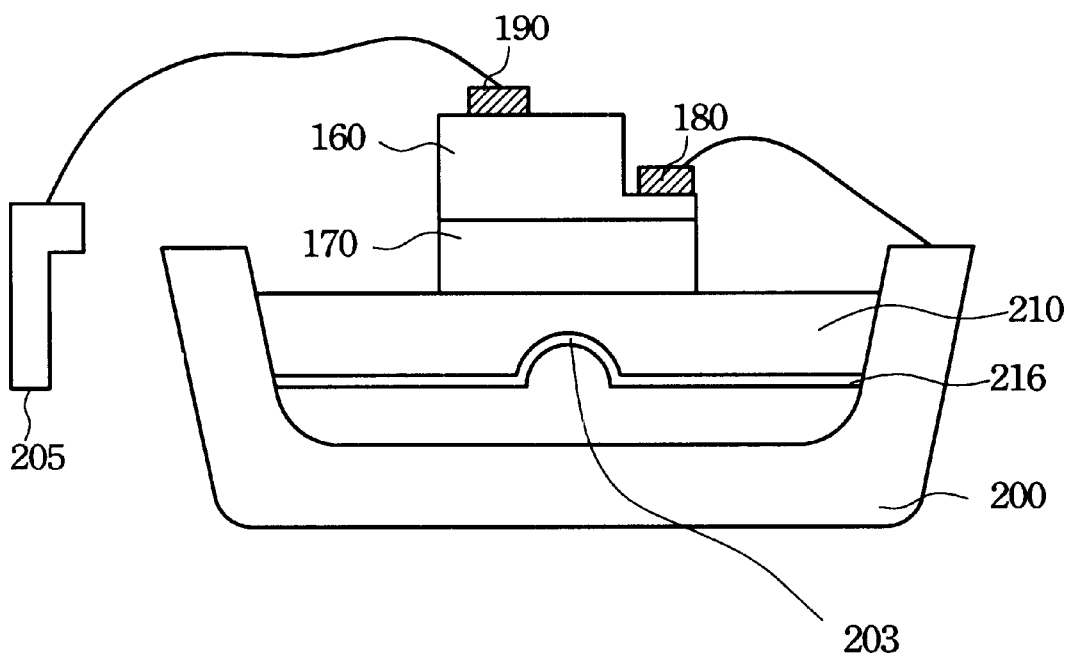

Referring to FIG. 5A, it shows the cross-sectional view of a light-emitting cell fixed on a die carrier of the present invention, which has a substrate made of electrically insulating material. The die carrier 200 has the same structure as described above. First, the present invention provides a sinking die carrier 200 on which a hemispheric lift 202 is formed by the casting technique. The light reflective layer 215 on the hemispheric lift 202 has high reflectance.

Then, a transparent layer 210 is formed upon the sinking surface of the die carrier 200, and the transparent substrate 170 of the light-emitting cell is fixed on the transparent layer 210. When the light-emitting cell is fixed upon the transparent layer 210, a first electrode 180 and second electrode 190 is electrically connected to another lead frame 205 and the die carrier 200. The packaging structure of the present invention is therefore obtained. Thus, when the light generated by the epitaxial structure 160 emits onto the hemispherical lift 202, the light is reflected into various directions and may not go back to the active layer of the epitaxial structure 160 again.

Referring to FIG. 5B, it is another embodiment of the present invention according to the structure of FIG. 5A, wherein the light reflective layer 216 is located in the transparent layer 210.

According to the two embodiments described above, when the light is generated by the epitaxial structure 160 and emitted from the transparent substrate 170, it runs through the transparent layer 210 and reaches the light reflective layer 215 or 216. Owing to the high reflectance of the light reflective layer 215 or 216, most of the light is reflected out of the structure. In this way, the light-emitting efficiency of the light-emitting cell can be increased.

Moreover, in order to prevent the reflected light from going back again to the active layer of the epitaxial structure 110 and light absorption of the active layer, the reflecting and absorbing phenomena causing the reduction of the efficiency of the LED, the present invention provides a design of the light reflective layer 215 or 216 with a hemispheric lift 202 and 203. When the light reaches the hemispheric lifts 202 and 203, the light is reflected to various directions so as to prevent the light from going back to the active layer of the light-emitting cell 160 and being absorbed by the active layer.

Figure 6:
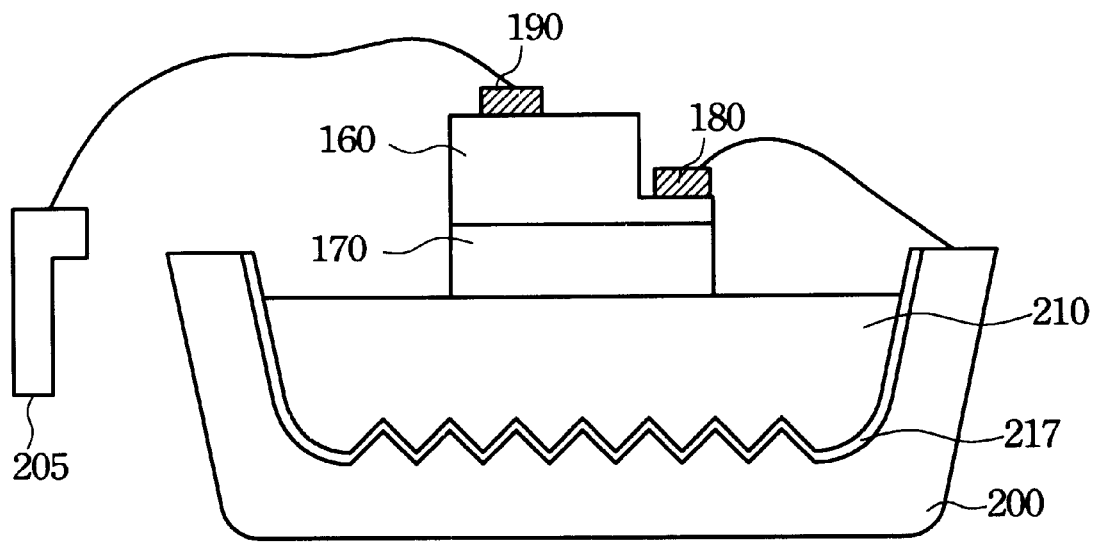
FIG. 6A is a cross-sectional view, showing the packaging structure comprising a light-emitting cell having the electrically insulating substrate fixed on a die carrier of the present invention.
FIG. 6B is showing another embodiment according to FIG. 6A, wherein the light reflective layer is located in the transparent conductor layer.
Figure 6B:
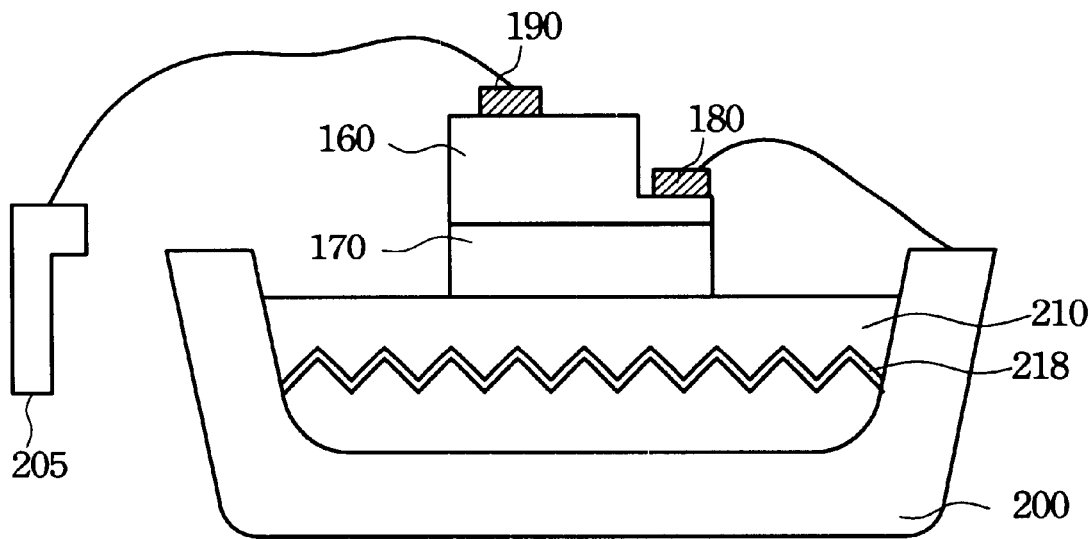

The pattern of hemispheric lift 202 or 203 of the light reflective layer 215 or 216 is merely stated as an embodiment for the present invention, and the invention is not limited thereto. As shown in FIGS. 6A and 6B, the light reflective layers 217 and 218 have a pattern of grating structure located respectively upon the die carrier 200 and in the transparent layer 210. Therefore, the grating structure also can prevent the reflected light from going back to the active layer of the epitaxial structure 160. The similar designs or functions have the same features of the present invention located within the scope of the present invention.

In fact, the substrate made of electrically insulating material of the present invention also can be replaced by a conductive material, so that electrodes of the light-emitting cell are located on the same side for the purpose of increasing the light-emitting efficiency.

Because the light-emitting cell of the present invention is an active device, the present invention also can apply to all the active light-emitting devices such as laser diodes, and passive photo detecting devices such as photo detecting diodes. With the utilization of the packaging structure of the present invention, the light receiving efficiency of the photo-receiving device can be increased significantly. Consequently, the electro-optics device of the present invention can further apply to all the through-hold electro-optics devices, surface-mounted electro-optics devices, and flip-chip electro-optics devices.

It is therefore an advantage of this invention to provide a method and a structure for packaging a high efficiency electro-optics device. A transparent material is added to a location between the die carrier and the electro-optics device, so that the light generated by the electro-optics device is not absorbed by cell fixing surface so as to sharply increase the light-emitting efficiency. When the present invention is used in the passive devices especially in the photo detecting devices, which have the structure and forming method described above, the devices' light receiving area can be increased and the devices' efficiencies can be improved.

It is therefore another advantage of this invention to provide a method and a structure for packaging a high efficiency electro-optics device. A light reflective layer is coated on the die carrier, and a pattern of the light reflective layer is designed to prevent the light from being reflected to the active layer so as to overcome the disadvantage of the poor light-emitting efficiency of the light-emitting device. When the present invention is used in the passive devices especially in the photo detecting devices, which have the structure and forming method described above, the light receiving efficiencies of the photo detecting devices can be increased and the sensitivity and the precision of the devices can be improved.

It is therefore still another advantage of this invention to provide a method and a structure for packaging a high efficiency electro-optics device. With the utilization of the present invention, the purpose of increasing the output power of the electro-optics device can be substantially achieved by increasing the optical path and light-sensing angle of the electro-optics device.

As is understood by a person skilled in the art, the foregoing preferred embodiments of the present invention are illustrations of the present invention rather than limitations of the present invention. It is intended to cover various modifications and similar arrangements comprised within the spirit and scope of the appended claims, the scope of which should be accorded the broadest interpretation so as to encompass all such modifications and similar structure.

What is claimed is:

1. A structure of a high efficiency electro-optics device, comprising:

a die carrier;

an electro-optics cell having a first electrode and a second electrode electrically connected respectively to said die carrier and a lead frame having an opposite polarity with respect to said first electrode and said second electrode;

a transparent layer located between said die carrier and said electro-optics cell for fixing said electro-optics cell on a surface of said transparent layer; and a light reflective layer located optionally in said transparent layer and between said transparent layer and said die carrier, wherein said light reflective layer has a pattern for changing an emitted light, which is generated by said electro-optics cell, to a reflected light and preventing said reflected light from going back to an active layer of said electro-optics cell.

2. The structure according to claim 1, wherein said die carrier is a through-hold lead frame.

3. The structure according to claim 1, wherein said die carrier is a print circuit board.

4. The structure according to claim 1, wherein said die carrier is a header.

5. The structure according to claim 1, wherein said electro-optics cell comprises a transparent conducting substrate and an epitaxial structure, and said first electrode and said second electrode are located on the same side or the different sides of said transparent conducting substrate.

6. The structure according to claim 1, wherein said transparent layer is selected from the group consisted of an indium tin oxide (ITO) layer, a cadmium tin oxide (CTO) layer, a zinc oxide (ZnO) layer, an indium zinc oxide (IZO) layer, and a nickel oxide (NiO) layer.

7. The structure according to claim 1, wherein said electro-optics cell comprises an insulating substrate and an epitaxial structure, and said first electrode and said second electrode are located on a plurality of different epitaxial layers of said epitaxial structure.

8. The structure according to claim 1, wherein said pattern comprises a plurality of hemispheric lifts.

9. The structure according to claim 1, wherein said pattern of said light reflective layer comprises a plurality of hemispheric and sinking forms.

10. The structure according to claim 1, wherein said pattern of said light reflective layer comprises a plurality of grating structures.

11. A structure of a high efficiency electro-optics device, comprising:

a die carrier;

an electro-optics cell having a first electrode and a second electrode electrically connected respectively to said die carrier and a lead frame having an opposite polarity with respect to said first electrode and said second electrode;

a transparent layer located between said die carrier and said electro-optics cell for fixing said electro-optics cell on a surface of said transparent layer, wherein said transparent layer is selected from the group consisted of an ITO layer, a CTO layer, a ZnO layer, an IZO layer, and a NiO layer; and a light reflective layer located optionally in said transparent layer and between said transparent layer and said die carrier, wherein said light reflective layer has a pattern for changing an emitted light, which is generated by said electro-optics cell, to a reflected light and preventing said reflected light from going back to an active layer of said electro-optics cell.

12. A The structure according to claim 11, wherein said die carrier is a through-hold lead frame, a print circuit board, or a header.

13. The structure according to claim 11, wherein said electro-optics cell comprises a transparent conducting substrate and an epitaxial structure, and said first electrode and said second electrode are located on the same side or the different sides of said transparent conducting substrate.

14. The structure according to claim 11, wherein said electro-optics cell comprises an insulating substrate and an epitaxial structure, and said first electrode and said second electrode are located on a plurality of different epitaxial layers of said epitaxial structure.

15. The structure according to claim 11, wherein said pattern comprises a plurality of hemispheric lifts, a plurality of hemispheric and sinking forms, or a plurality of grating structures.

16. A structure of a high efficiency electro-optics device, comprising:

a die carrier;

an electro-optics cell having a first electrode and a second electrode electrically connected respectively to said die carrier and a lead frame having an opposite polarity with respect to said first electrode and said second electrode;

a transparent layer located between said die carrier and said electro-optics cell for fixing said electro-optics cell on a surface of said transparent layer; and a light reflective layer located optionally in said transparent layer and between said transparent layer and said die carrier, wherein said light reflective layer has a pattern for changing an emitted light, which is generated by said electro-optics cell, to a reflected light and preventing said reflected light from going back to an active layer of said electro-optics cell, wherein said pattern comprises a plurality of hemispheric lifts, a plurality of hemispheric and sinking forms, or a plurality of grating structures.

17. The structure according to claim 16, wherein said die carrier is a through-hold lead frame, a print circuit board, or a header.

18. The structure according to claim 16, wherein said electro-optics cell comprises a transparent conducting substrate and an epitaxial structure, and said first electrode and said second electrode are located on the same side or the different sides of said transparent conducting substrate.

19. The structure according to claim 16, wherein said transparent layer is selected from the group consisted of an ITO layer, a CTO layer, a ZnO layer, an IZO layer, and a NiO layer.

20. The structure according to claim 16, wherein said electro-optics cell comprises an insulating substrate and an epitaxial structure, and said first electrode and said second electrode are located on a plurality of different epitaxial layers of said epitaxial structure.

* * * * *